United States Patent [19]

Abernathey et al.

[11] Patent Number: 4,755,478
[45] Date of Patent: Jul. 5, 1988

[54] METHOD OF FORMING METAL-STRAPPED POLYSILICON GATE ELECTRODE FOR FET DEVICE

[75] Inventors: John R. Abernathey, Essex; John E. Cronin, Milton; Jerome B. Lasky, Essex Junction, all of Vt.

[73] Assignee: International Business Machines Corporation, Armonk, N.Y.

[21] Appl. No.: 84,719

[22] Filed: Aug. 13, 1987

[51] Int. Cl.[4] .......................................... H01L 21/425
[52] U.S. Cl. ........................................ 437/41; 437/34; 437/57; 437/200; 437/913
[58] Field of Search ..................... 437/42, 34, 200, 41, 437/57, 913

[56] References Cited

U.S. PATENT DOCUMENTS

| | | | |
|---|---|---|---|
| 4,441,247 | 4/1984 | Gargini et al. | 29/571 |
| 4,453,306 | 6/1984 | Lynch et al. | 437/40 X |
| 4,470,874 | 9/1984 | Bartush et al. | 156/643 |
| 4,502,914 | 3/1985 | Trumpp et al. | 156/643 |
| 4,505,027 | 3/1985 | Schwabe et al. | 437/245 X |
| 4,587,718 | 5/1986 | Haken et al. | 437/200 |
| 4,593,454 | 6/1986 | Baudrant et al. | 437/200 |
| 4,648,175 | 3/1987 | Metz, Jr. et al. | 437/192 |
| 4,707,456 | 11/1987 | Thomas et al. | 437/34 X |

OTHER PUBLICATIONS

"Raised Source/Drain Structure," B. Davari et al, *IBM TDB*, vol. 29, No. 9, Feb. 1987, pp. 4073–4074.
"Controlled Ohmic Contact and Planarization for Very Shallow Junction Structures," T. M. Reith et al, *IBM TDB*, vol. 20, No. 9, FEB. 1978, pp. 3480–3483.
"A New Bird's Beak Free Field Isolation Technology for VLSI Devices," K. Kurosawa et al, 1981, *IEEE, IEDM 81*, pp. 384–387.
"Selective Tungsten Deposition in a Varian/Torrex 5101 Cold Wall CVD Reactor," R. F. Foster et al, 1987 Materials Research Society, pp. 147–155.

*Primary Examiner*—George T. Ozaki
*Attorney, Agent, or Firm*—Mark F. Chadurjian

[57] ABSTRACT

A process for forming a planarized, low sheet resistance FET. A gate stack is defined on an exposed surface of a semiconductor substrate, the gate stack including a gate mask disposed on a patterned polysilicon layer. First and second diffusion having first and second silicide electrodes are then formed on the substrate, to provide low sheet resistance source and drain electrodes. An insulating layer is then formed on the substrate, and is planarized to expose an upper surface of the gate mask. The gate mask is then removed in wet $H_3PO_4$ to define an aperture in the insulating layer that exposes the polysilicon layer, and a conductive material is selectively grown on the substrate to provide a metal-strapped polysilicon gate electrode that is relatively co-planar with the planarized insulating layer.

16 Claims, 2 Drawing Sheets

METHOD OF FORMING METAL-STRAPPED POLYSILICON GATE ELECTRODE FOR FET DEVICE

CROSS-REFERENCE TO RELATED APPLICATIONS

Reference is made to co-pending U.S. patent application Ser. No. 791,860, entitled "Chem-Mech Polishing Method for Producing Co-Planar Metal/Insulator Films on a Substrate," filed Oct. 28, 1985, by Beyer et al and assigned to the assignee of the present invention. This application relates to a method for producing coplanar metal/insulator films on a substrate according to a chemical-mechanical (chem-mech) polishing technique utilizing an improved polishing slurry. The invention is particularly directed to the fabrication of planarized multi-level metal semiconductor structures.

Reference is also made to co-pending U.S. patent application Ser. No. 927,623, entitled "Polyimide Stud Transfer Process," filed Nov. 6, 1986, by Chaloux, Jr., et al and assigned to the assignee of the present invention. The application relates to a method for forming a mask, covering the mask with a thick oxide layer, planarizing the oxide layer to expose the underlying mask, and removing the mask to subsequently define conductive structures in the planarized oxide layer.

TECHNICAL FIELD

The present invention relates to reducing the sheet resistance of the source, gate and drain electrodes of an FET device.

BACKGROUND ART

In the manufacture of highly dense semiconductor memory devices, a greater number of storage cells are coupled together along a single conductive line. This conductive line (i.e., word line) typically forms the control electrode of at least one of the devices that comprise a given memory cell. For example, in the so called one-device dynamic random access memory cell comprising a transistor coupled to a storage capacitor, the word line provides the gate electrode of the transistor.

It is known in the art to reduce the sheet resistance of word lines by utilizing low resistance conductors such as aluminum. Back in the early to mid 1970's those materials were widely accepted throughout the industry. However, the development of the self-aligned FET (in which the source and drain impurity regions are implanted into regions of the substrate partially defined by the gate electrode) necessitated the adoption of heat-resistant conductors such as polysilicon.

Another method of reducing sheet resistance is to use refractory metal silicides that are formed on top of (i.e., "strap") a polysilicon gate. Typically, as shown in U.S. Pat. No. 4,593,454 (issued June 10, 1986 to Baudrant et al), a silicide layer is formed simultaneously over the gate electrode and the source/drain difusion regions of an FET device. More specifically, after a polysilicon gate electrode has been defined on a substrate, ions are implanted to define the source/drain diffusion regions. Then an oxide layer is deposited and etched so that the sidewalls of the polysilicon gate electrode are covered with oxide. Then a refractory metal layer (the patent utilizes tantalum) is deposited on the substrate, and a heat cycle is carried out to form tantalum silicide in those portions of the tantalum disposed on exposed silicon. Note that the oxide disposed on the sidewalls of the polysilicon gate electrode prevent the silicide formed on the upper surface of the gate electrode from being connected to the silicide formed on the source/drain regions.

The general simultaneous gate and source/drain silicide formation process as exemplified by the Baudrant et al patent suffers from several shortcomings. A recent trend in the semiconductor industry is to decrease the depth of the source/drain diffusion regions to less than 0.5 microns. These so-called "shallow junctions" are more resistant to punchthrough defects as the channel length of FET's is decreased below the one micron barrier. If a refractory metal is deposited over the shallow junctions to form a silicide thereon, the amount of junction silicon consumed during the silicide reaction may substantially degrade the characteristics of these shallow junction regions. In the prior art, this problem has been addressed by incorporating extra silicon at the shallow junction surface prior to refractory metal deposition. For example, as shown in an article by Reith et al, entitled "Controlled Ohmic Contact and Planarization For Very Shallow Junction Structures," *IBM Technical Disclosure Bulletin*, Vol. 20, No. 9, Feb. 1979, pp. 3480–3482, after implantation epitaxial silicon is grown so as to maintain the integrity of the shallow junctions after silicide formation. This process presents a tradeoff. By decreasing the silicon consumption of the source/drain regions by selective epi growth, the high temperature inherent in this process will drive the source/drain dopants further into the substrate, thus degrading the desired shallow junction characteristics.

In U.S. Pat. No. 4,587,718 (issued May 13, 1986 to Haken et al) the gate electrode silicide is formed prior to the source/drain silicides. A nitride mask is used to define a polysilicon gate electrode atop an oxide layer that completely covers the device area. The source/drain diffusion regions are then formed by implantation through this oxide layer, using the nitride/poly stack as an implantation mask. The nitride mask is then removed, and a layer of refractory metal is deposited on the substrate. The refractory metal layer (in this case titanium) will react with the exposed polysilicon gate without forming a silicide over the source/drain regions, because these regions are covered with the silicon oxide layer. After the gate electrode silicide formation process is completed, the oxide layer above the source/drain diffusion regions is removed, and a second layer of titanium is deposited on the substrate. During the course of the subsequent source/drain silicide reaction, the earlier-formed titanium silicide gate electrode will increase in thickness. Thus, a thick titanium silicide layer is formed on the gate electrode, and a thin titanium silicide layer is formed over the source/drain regions.

See also U.S. Pat. No. 4,453,306 (issued June 12, 1984 to Lynch et al). After the gate electrode silicide is formed, the upper surface of the electrode is covered with oxide. Subsequently, polysilicon is deposited on the device, and is patterned so that it overlays only the source/drain regions. Cobalt is then deposited on the device and is sintered to form cobalt silicide electrodes on the source/drain regions. The oxide atop the silicide gate electrode prevents further silicide formation thereon.

The present inventors have investigated various methods of reducing the sheet resistance of the gate electrode below that obtained by refractory metal silicides. Tungsten silicide provides a resistivity of approximately 50 micro ohms-cm. On the other hand, a tungsten layer has a resistivity of approximately 10 micro ohms-cm, and an aluminum layer has a resistivity on the order of 3 micro ohms-cm. Thus, the inventors considered modifying an approach similar to the Lynch et al patent by replacing the silicide gate formation step with depositing either tungsten or aluminum. However, this modification would not achieve the intended result. If tungsten were to be deposited on top of a layer of polysilicon, the layers would react to form a silicide during the subsequent implant drive-in and source/drain silicide formation steps. This would greatly increase the sheet resistance of the gate electrode by forming tungsten silicide (as opposed to pure tungsten). Similarly, the physical/electrical qualities of an aluminum layer (or an aluminum alloy such as aluminum/silicon) would substantially degrade when exposed to these high processing temperatures.

Another potential problem is presented by forming a refractory metal silicide on the gate electrode. Some CMOS circuits utilize so-called "dual work function" gate electrodes. In this technology, the polysilicon gates for the n-channel and p-channel devices are doped with P-type and N-type dopants, respectively, in order to achieve an enhanced p-channel device characteristic. If these differentially-doped polysilicon gate electrodes are covered with a refractory metal layer for subsequent silicide formation, the polysilicon dopants may intermix (due to the high dopant diffusivity in refractory metal silicides) to destroy the above dual-work function advantages.

Accordingly, a need has developed in the art to provide a FET device having a low sheet resistance metal-strapped polysilicon gate electrode as well as silicide source/drain electrodes.

SUMMARY OF THE INVENTION

It is thus an object of the invention to provide the lowest possible sheet resistance metal-strapped polysilicon gate electrode for an FET device.

It is another object of the invention to provide low sheet resistance silicide electrodes for the source/drain regions of an FET device.

It is yet another object of the invention to provide a low sheet resistance FET device having a planar upper surface.

It is a further object of the invention to provide the shallowest possible source/drain regions for the FET device while also providing low sheet resistance silicide electrodes for the source/drain regions.

It is yet a further object of the invention to minimize the sheet resistance of the gate electrode of an FET without causing intermixing of dual work function dopants.

These and other objects of the present invention are realized by a process for forming a low sheet resistance metal-strapped polysilicon gate FET. A gate stack is defined on an exposed surface of a semiconductor substrate. The gate stack includes a gate mask disposed on a patterned polysilicon layer. Using the gate stack as a supplemental implant and electrode formation mask, first and second shallow diffusion regions are formed having first and second silicide electrodes disposed on them. An insulating layer is then deposited on the substrate. The insulating layer has a thickness that is substantially equal to that of said gate stack. The insulator layer is planarized so as to expose an upper surface of said gate mask and the gate mask is removed to define an aperture in the insulating layer that exposes the polysilicon layer. N-type and p-type dopants are introduced to selected regions of the exposed polysilicon to define dual work function gates, and a low sheet resistance conductive material is deposited on the substrate to at least partially fill the aperatures in said insulating layer so as to form a gate electrode of said FET that is relatively co-planar with the planarized insulating layer.

BRIEF DESCRIPTION OF THE DRAWING

The foregoing and other structures and teachings will be come more apparent upon a detailed description of the best mode for carrying out the invention as rendered below. In the description to follow, reference will be made to the accompanying drawing, in which.

DESCRIPTION OF THE BEST MODE FOR CARRYING OUT THE INVENTION

Figure 1:
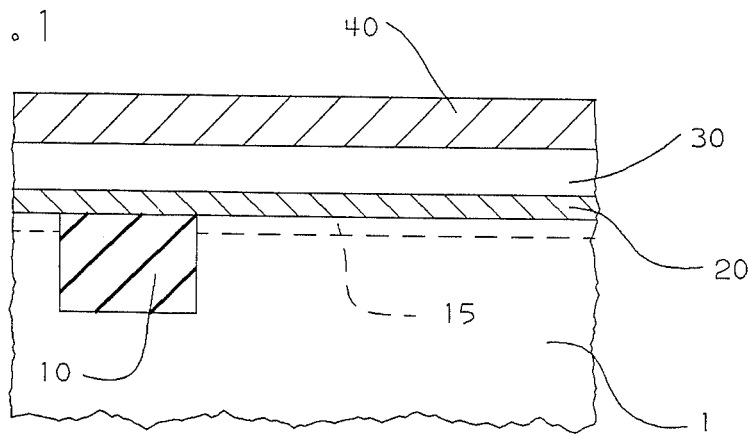
FIGS. 1–6 are cross-sectional views of a semiconductor substrate undergoing the process sequence of the invention.

As shown in FIG. 1, layers of polysilicon 30 and silicon nitride 40 are formed on a substrate 1. The substrate 1 is a P+ type, <100> monocrystalline silicon wafer having an isolation region 10 formed therein. In practice, a thin p-type epitaxial layer is grown on the p+ substrate, and an n-well is formed in selected portions of the epitaxial layer. The epitaxial layer and the n-well are not shown solely for the sake of simplicity. The isolation region 10 could be conventional semi-recessed oxide isolation (S-ROX) structures. However, it is contemplated that the present invention will be utilized in conjunction with highly dense technologies in which the width of the isolation regions must be tightly controlled. Moreover, for reasons that will be discussed in more detail below, it is important in the present invention to retain a relatively high degree of planarity between the upper surface of the substrate and the upper surface of the isolation region. Accordingly, it is preferred to utilize an isolation structure that is fully buried in the substrate. An example of such a structure is shown in an article by Kurosawa et al, "A New Bird's Beak Free Isolation for VLSI," *IEDM Digest of Technical Papers* 1981, p. 384, the teachings of which are incorporated herein by reference.

Diffusion region 15 is then formed by simply implanting dopant into the substrate after the isolation region 10 is formed. Diffusion region 15 is formed by implanting or diffusing an n-type dopant. The purpose of region 15 is to control the threshold voltages of the FET devices to be subsequently formed.

After the diffusion region 15 is provided, a thin dielectric layer 20 is formed on the exposed surface of the substrate. Typically, dielectric layer 20 is a 100 Angstrom thick layer of silicon oxide. In practice, other structures having suitable dielectric properties (e.g. silicon oxynitride, silicon nitride, or a plurality of silicon nitride and silicon oxide layers) could also be used. A 2000 Angstrom thick layer of p-type polycrystalline silicon 30 is then deposited on the dielectric layer 20 using conventional techniques, and a 2500 Angstrom thick layer of CVD silicon nitride 40 is formed on the polysilicon layer 30, also using conventional techniques.

Figure 2:
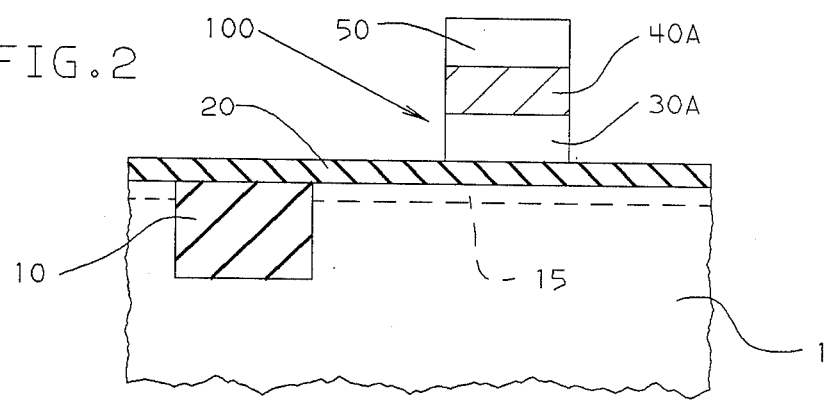

With reference to FIG. 2, a layer of photosensitive polymer (e.g., a novolak-based photoresist) is coated on the silicon nitride layer 40, and is exposed and developed to define a photomask 50 having substantially vertical sidewalls. The exposed portions of silicon nitride layer 40 and polysilicon layer 30 are then sequentially etched in a directional mode to define a gate stack 100 that includes a silicon nitride portion 40A and a polysilicon portion 30A. In practice, the silicon nitride layer can be patterned by exposure to a $CF_4/O_2$ plasma and the polysilicon layer 30 can be patterned by exposure to an $HCl/Cl_2$ gaseous plasma.

At this point in the process, note that the silicon nitride portion 40A defines a masking structure above the polysilicon gate electrode 30A.

Figure 3:
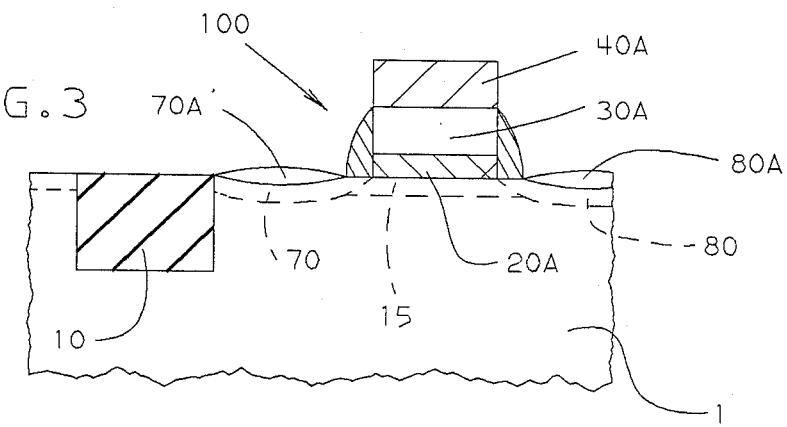

With reference to FIG. 3, after photomask 50 is removed, sidewall spacers 60 are formed on the exposed sides of polysilicon portion 30A. The sidewall spacers 60 can be formed using one or two methods. The first method is to simply oxidize the exposed surfaces of polysilicon portion 30A. Note that the overlying silicon nitride masking structure 40A prevents the upper surface of polysilicon portion 30A from being oxidized during this step. The preferred method is to deposit a layer of oxide over the entire structure, and directionally etch the deposited layer so that it is removed from the horizontal surfaces of the substrate. During this removal step, exposed portions of the underlying oxide layer 20 are also removed to define gate dielectric 20A.

After sidewall spacers 60 are formed, the source and drain regions 70, 80 are formed, and silicide electrodes 70A, 80A are formed thereon, respectively. The diffusion regions and silicide electrodes can be formed using one of several techniques. One technique is to simply implant the dopant ions to define the diffusion regions using the gate stack 100 as an implantation mask, deposit a refractory metal such as cobalt or titanium over the substrate, and sinter the structure to form $CoSi_2$ or $TiSi_2$ over the junction regions. Note that the silicon nitride 40A and the sidewalls 60 prevent the refractory metal from combining with polysilicon 30A to form a gate silicide. A first alternative is to first grow epitaxial silicon over the exposed silicon regions in order to reduce the amount of silicon consumed during the silicide reaction, and then to carry out the above-described implant, refractory metal deposition and anneal steps. This first alternative would be employed when shallow junctions are desired. Another alternative is to deposit the refractory metal (e.g. cobalt), heat treat the substrate for an amount of time sufficient to form a metal-rich silicide (by carrying out the anneal at temperatures or for times that are insufficient to form a silicon-rich silicide), remove the refractory metal without removing the metal-rich silicide, implant ions into the metal-rich silicide, and anneal the substrate in order to drive the dopants out of the metal-rich silicide to define shallow source/drain junction regions while converting the metal-rich silicide into silicon-rich silicide. This latter alternative is preferred, in that it is compatible with shallow junctions without necessitating selective epitaxial silicon growth. Whichever method is chosen, the key factor is that the process is carried out in the presence of a masking structure atop the polysilicon gate. Thus, the silicide formation and dopant diffusion steps, which are typically carried out at temperatures ranging between 800° C.–1000° C., are performed prior to complete formation of the gate electrode of the FET.

Figure 4:
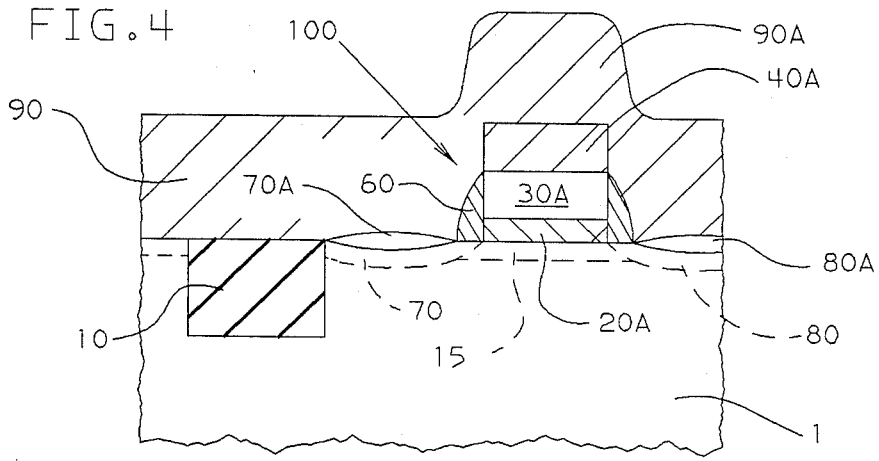

As shown in FIG. 4, the substrate is then covered with a thick conformal layer 90, preferably of silicon dioxide. The thickness of the deposited conformal layer 90 should be slightly less than the gate stack 100 thickness (i.e., approximately 4500 Angstroms). This thickness differential is needed to account for variations in the topography across the wafer surface. For example, although the isolation region 10 is constructed to have a surface that is relatively co-planar with the upper surface of substrate 1, in practice the surface of isolation region 10 may extend above the surface of substrate 1. Moreover, note that a portion 90A of conformal layer 90 extends above the upper surface the gate stack 100. The thickness differential between conformal layer 90 and gate stack 100 is particularly important in removing portion 90A by polishing as described below.

Figure 5:
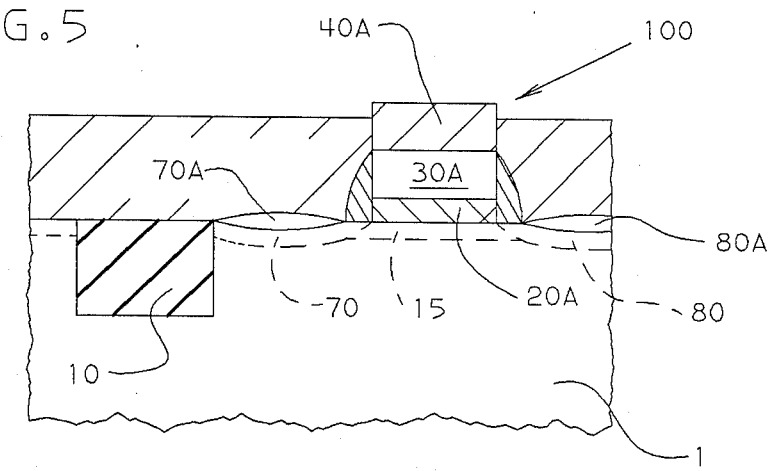

As shown in FIG. 5, the surface of conformal layer 90 is then planarized so as to remove portion 90A extending above the upper surface of the gate stack 100. A preferred method of planarizing the conformal layer 90 is to subject the wafer to a mechanical polishing procedure in the presence of an abrasive slurry. More specifically, a slurry commercially available from Cabot Corp. under the tradename "Cabot SC01" is supplied to a Strasbaugh wafer polishing tool having a Suba IV perforated abrasive pad held at a pressure of 6–8 psi. It has been found that carrying out this procedure for approximately four minutes is sufficient to remove portion 90A and to planarize the bulk film 90. That is, after portion 90A of layer 90 is removed, the polishing pad contacts the upper surface of the remainder of the conformal layer. It has been found that the frictional force experienced by the polishing pad greatly increases as the polishing pad contacts the bulk conformal layer surface. The force experienced by the pad can be monitored, such that the polishing procedure can be stopped at this point or continued for a discrete amount of time afterward. Thus, as shown in FIG. 5, the upper surface of the silicon nitride masking structure is approximately co-planar with, and is exposed by, the remaining portions of conformal layer 90. Another planarization method consists of coating the surface of conformal oxide layer 90 with a layer of photoresist, and exposing the substrate to an etchant that will remove the photoresist and the underlaying oxide at substantially the same rate. Since the photoresist is a non-conformal layer, its planar upper surface is simply replicated in the oxide layer. This method is discussed in the above-mentioned U.S. patent application Ser. No. 927,623.

Figure 6:
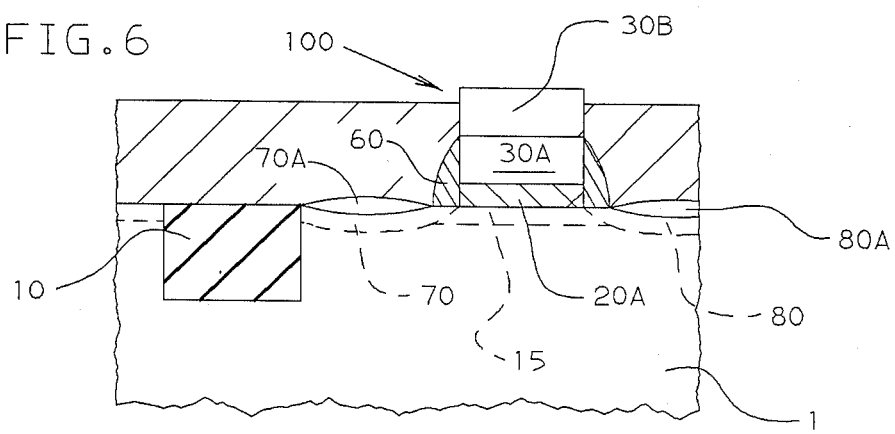

Then, as shown in FIG. 6, the silicon nitride masking structure is removed to expose the underlaying portion of polysilicon gate 30A. In practice, silicon nitride can be removed without appreciably attacking silicon dioxide or polysilicon by exposure to $H_3PO_4$ solvent at a temperature of 165° C.

After the silicon nitride mask is removed, a block mask is deposited over the n-channel devices, and the exposed polysilicon within the exposed vias is implanted with p-type impurity. Then a second block mask (the complement of the first block mask) is defined, and the exposed polysilicon is implanted with an n-type dopant. Thus, the dual work-function implants are carried out after the polysilicon has been patterned and after the silicon nitride mask is removed. If the implants were carried out before the polysilicon was patterned, the resulting n and p doped polysilicon regions would subsequently etch at different rates. If the implants were carried out after patterning, the high implant energy required to penetrate the silicon nitride mask may result in the undesired doping other structures.

Finally, metal 30B is deposited and defined (as needed) to strap the FET gate electrode. It is preferred to form metal layer 30B of selective tungsten. Under conditions discussed in an article by Foster et al, entitled "Selective Tungsten Deposition In a Varian/Torrex Cold Wall CVD Reactor." *Tungsten and Other Refractory Metals for VLSI II*, (Conference Proceedings, Nov. 12-14, (1986), pp. 147-155, the teachings of which are incorporated herein by reference, tungsten can be chemically vapor deposited such that it only grows on silicon. Thus, tungsten can be grown to fill the space that was previously defined by nitride mask 40A. Such a procedure eliminates the need to etch back the deposited metal. One alternative is to first deposit a thin barrier layer (such as titanium/tungsten or titanium nitride) and then deposit a metal such as aluminum. The barrier layer would prevent spiking of the aluminum to the underlying polysilicon portion 30A. Portions of the Ti/W and aluminum layers lying above conformal layer 90 could then be removed by conventional photoresist planarization and etchback techniques. Thus, the process of the invention provides an FET device having a low sheet resistance gate electrode as well as silicide source and drain electrodes. By the method of the invention, the tungsten component of the tungsten-polysilicon composite gate electrode is not introduced until after the hot process steps associated with the source/drain dopant diffusion and silicide formation steps are carried out. Thus tungsten (which normally forms a silicide with silicon at a temperature of approximately 600° C.) will not interact with the underlying polysilicon to form a silicide, greatly decreasing the sheet resistance of the composite gate electrode.

Another advantage of the invention is that the final structure is planar as between the final gate electrode and the surrounding conformal oxide layer. Thus, when a passivating oxide layer is subsequently deposited on the formed device, there is no need to reflow the passivation layer so as to form a planar upper surface. Conventionally, this reflow step is carried out at a temperature of 800°-1000° C. Thus, the invention further reduced the risk of silicide gate formation by eliminating a subsequent hot process step that is normally carried out in conventional device fabrication processes, while also providing an FET device that is more compatible with multiple levels of metal.

Another advantage of the present invention is that the metal on top of the polysilicon does not allow intermixing of the dual work function polysilicon dopants. Thus, the invention provides a low sheet resistance gate electrode that is compatible with dual work function CMOS polysilicon gate technology.

While the above structures and teaching have been discussed with reference to a description of the best mode for carrying out the present invention, it will be understood by those skilled in the art that changes in form and detail may be made without departing from the spirit and scope of the invention described herein.

We claim:

1. A process for forming a planarized, metal-strapped polysilicon gate FET, comprising the steps of:
    defining a gate stack on an exposed surface of a semiconductor substrate, said gate stack including a gate mask disposed on top of a patterned polysilicon layer and a dielectric structure disposed between said patterned polysilicon layer and said semiconductor substrate;
    defining first and second diffusion regions in said substrate having first and second silicide electrodes disposed thereon, said first and second diffusion regions being self-aligned to said gate stack and forming source and drain electrodes of said FET, said gate mask preventing silicide formation over said polysilicon layer;
    depositing an insulating layer on said substrate, said insulating layer having a thickness substantially equal to that of said gate stack;
    planarizing said insulating layer so as to expose an upper surface of said gate mask;
    removing said gate mask to define an aperture in said insulating layer that exposes said polysilicon layer; and
    depositing a low sheet resistance conductive material on said substrate to at least partially fill said aperture in said insulating layer so as to form a gate electrode of said FET that is relatively co-planar with said planarized insulating layer.

2. The process as recited in claim 1, further comprising, prior to said step of defining a gate stack, the step of:
    defining isolation regions in said surface of said semiconductor substrate, said isolation regions having an upper surface that is relatively co-planar with said exposed surface of said semiconductor substrate.

3. The process as recited in claim 2, wherein said step of defining first and second diffusion regions and first and second silicide electrodes comprises the steps of:
    implanting dopant ions into portions of said substrate exposed by said gate mask and said isolation regions;
    annealing said substrate to diffuse said implanted dopant ions therein;
    depositing a layer of refractory metal on said surface of said substrate;
    annealing said substrate to form silicides in portions of said refractory metal that contact said semiconductor substrate; and
    removing remaining portions of said refractory metal layer without appreciably attacking said silicide regions.

4. The process as recited in claim 3, wherein said refractory metal comprises titanium.

5. The process as recited in claim 2, wherein said step of defining said first and second diffusion regions comprises the steps of:
    depositing a layer of refractory metal on said semiconductor substrate;
    annealing said semiconductor substrate in order to form metal-rich silicide regions in portions of said refractory metal layer disposed on exposed portions of said semiconductor surface;
    removing remaining portions of said refractory metal layer without appreciably attacking said metal-rich silicide regions;
    implanting dopant ions into said metal-rich silicide regions; and
    annealing said substrate so as to diffuse said dopant ions from said metal-rich silicide regions into underlying portions of said semiconductor substrate while converting said metal-rich silicide regions into silicon-rich silicide regions.

6. The process as recited in claim 5, wherein said refractory metal is comprised of cobalt.

7. The process as recited in claim 1, wherein said insulating layer is comprised of a conformal layer of silicon oxide.

8. The process as recited in claim 7, wherein said step of planarizing said insulating layer comprises physically polishing said insulating layer in the presence of an abrasive slurry.

9. The method as recited in claim 7, wherein said step of planarizing said insulating layer comprises depositing a planarizing layer on said insulating layer, and exposing said substrate to an etchant which removes said planarizing layer and said insulating layer at substantially the same rate.

10. The process as recited in claim 1, wherein said step of defining said gate stack comprises the steps of:
    forming a thin dielectric structure on said surface of said substrate;
    depositing a layer of doped polysilicon on said thin dielectric structure;
    depositing a masking layer on said doped polysilicon layer;
    patterning said masking layer to define said gate mask; and
    removing portions of said doped polysilicon layer exposed by said gate mask.

11. The process as recited in claim 10, wherein said dielectric structure is comprised of a material selected from the group consisting of silicon oxide, silicon nitride, and silicon oxynitride.

12. The process as recited in claim 10, wherein said mask material is comprised of silicon nitride.

13. The process as recited in claim 1, wherein said step of removing said gate mask comprises exposing said substrate to $H_3PO_4$.

14. The process as recited in claim 1, wherein said conductive material is selectively grown only on an exposed surface of said polysilicon layer.

15. A process for forming a planarized, metal-strapped polysilicon gate FET, comprising the steps of:
    defining planarized isolation structures on a surface of a semiconductor substrate;
    defining a gate stack on said semiconductor substrate, said gate stack, comprising a layer of silicon nitride, a layer of doped polysilicon, and a thin dielectric structure;
    defining first and second diffusion regions in said substrate having first and second silicide regions thereon, said first and second diffusion regions being self-aligned to said gate stack and forming source and drain electrodes, respectively, of said FET;
    depositing a conformal insulating layer on said substrate, said insulating layer having a thickness substantially equal to that of said gate stack;
    planarizing said insulating layer so as to expose said silicon nitride layer;
    removing said silicon nitride layer without substantially etching either of said insulating layer or said polysilicon layer, so as to define an aperture in said insulating layer; and
    selectively growing conductive material on said polysilicon layer to at least partially fill said aperture in said insulating layer, to form a gate electrode of said FET that is relatively co-planar with said planarized insulating layer.

16. The method as recited in claim 15, wherein said first and second diffusion regions extend less than 0.5 micron into said substrate.

* * * * *